United States Patent
Deng et al.

(10) Patent No.: US 12,341,116 B2
(45) Date of Patent: Jun. 24, 2025

(54) CHIP PACKAGE STRUCTURE, PREPARATION METHOD, AND ELECTRONIC DEVICE

(71) Applicant: HUAWEI TECHNOLOGIES CO., LTD., Shenzhen (CN)

(72) Inventors: Chaojun Deng, Dongguan (CN); Xiaoyun Wei, Dongguan (CN); Yong Yang, Xi'an (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 175 days.

(21) Appl. No.: 17/560,583

(22) Filed: Dec. 23, 2021

(65) Prior Publication Data

US 2022/0216171 A1   Jul. 7, 2022

(30) Foreign Application Priority Data

Jan. 6, 2021   (CN) .......................... 202110010279.1
Apr. 22, 2021  (CN) .......................... 202110436129.7

(51) Int. Cl.
| | |
|---|---|
| *H01L 23/00* | (2006.01) |
| *H01L 23/15* | (2006.01) |
| *H01L 23/498* | (2006.01) |
| *H01L 25/065* | (2023.01) |

(52) U.S. Cl.
CPC .............. *H01L 24/12* (2013.01); *H01L 23/15* (2013.01); *H01L 23/49822* (2013.01); *H01L 23/49894* (2013.01); *H01L 25/0652* (2013.01); *H01L 25/0655* (2013.01); *H01L 25/0657* (2013.01); *H01L 2224/81801* (2013.01)

(58) Field of Classification Search
CPC ... H01L 24/12; H01L 23/15; H01L 23/49822; H01L 23/49894; H01L 25/0652; H01L 25/0655; H01L 25/0657
See application file for complete search history.

(56) References Cited

U.S. PATENT DOCUMENTS

| | | | | |
|---|---|---|---|---|
| 4,943,470 A | * | 7/1990 | Shiromizu | H01L 23/15 |
| | | | | 428/209 |
| 5,227,583 A | * | 7/1993 | Jones | H01L 23/15 |
| | | | | 438/125 |
| 5,294,750 A | * | 3/1994 | Sakai | H01L 23/49822 |
| | | | | 257/E23.113 |
| 5,889,322 A | * | 3/1999 | Hamada | H01L 23/15 |
| | | | | 257/E23.009 |
| 6,183,874 B1 | * | 2/2001 | Yamagata | H01L 21/4807 |
| | | | | 428/323 |
| 6,232,251 B1 | * | 5/2001 | Terashi | C03C 10/0009 |
| | | | | 257/E23.009 |

(Continued)

*Primary Examiner* — Nathan W Ha
(74) *Attorney, Agent, or Firm* — Maier & Maier, PLLC

(57) ABSTRACT

A chip package structure includes a glass substrate, a routing layer, and a plurality of dies. A first surface of the glass substrate has solder joints and a second surface of the glass substrate has substrate solder balls. The routing layer is located in the glass substrate, and the solder joints are electrically connected to the substrate solder balls by using the routing layer. Each die has chip solder balls, is located on the first surface of the glass substrate, and the solder joints are bonded to the chip solder balls. The embodiments can improve connection reliability between the die and the glass substrate and can reduce a signal transmission loss.

16 Claims, 5 Drawing Sheets

(56) References Cited

U.S. PATENT DOCUMENTS

| | | | |
|---|---|---|---|
| 6,674,159 B1* | 1/2004 | Peterson | H01L 27/14618 257/434 |
| 2001/0029228 A1* | 10/2001 | Terashi | C03C 10/0054 501/153 |
| 2004/0089472 A1* | 5/2004 | Ninomiya | H05K 1/183 29/830 |
| 2004/0154164 A1* | 8/2004 | Kang | H01L 25/0657 29/841 |
| 2005/0212129 A1* | 9/2005 | Huang | H01L 23/3128 257/676 |
| 2006/0234023 A1* | 10/2006 | Endou | H01L 23/15 428/210 |
| 2007/0187137 A1* | 8/2007 | Isebo | H05K 1/183 174/262 |
| 2007/0224400 A1* | 9/2007 | Meguro | H01L 21/4846 428/209 |
| 2009/0032926 A1 | 2/2009 | Sharifi | |
| 2011/0217657 A1* | 9/2011 | Flemming | H01L 23/49827 29/874 |
| 2011/0304999 A1* | 12/2011 | Yu | H01L 23/5384 29/829 |
| 2014/0057391 A1 | 2/2014 | Lin et al. | |
| 2014/0124822 A1* | 5/2014 | Yan | H01L 33/641 257/99 |
| 2014/0153262 A1* | 6/2014 | Ohta | H01L 23/15 362/382 |
| 2014/0204541 A1* | 7/2014 | Kozuki | H05K 1/0306 361/748 |
| 2015/0091179 A1 | 4/2015 | Shenoy et al. | |
| 2015/0235991 A1* | 8/2015 | Gu | H01L 25/105 174/262 |
| 2015/0279756 A1* | 10/2015 | Erlesand | C25D 5/02 174/257 |
| 2015/0380331 A1* | 12/2015 | Inaba | H01L 25/18 257/693 |
| 2016/0167951 A1* | 6/2016 | Goida | H01L 23/34 257/737 |
| 2016/0181193 A1* | 6/2016 | Hsu | H01L 23/5389 438/119 |
| 2017/0150600 A1* | 5/2017 | Day | H05K 1/0306 |
| 2017/0280562 A1* | 9/2017 | Zuo | H05K 1/181 |
| 2018/0017741 A1* | 1/2018 | Ho | G02B 6/4257 |
| 2018/0158771 A1 | 6/2018 | Akiba et al. | |
| 2018/0240746 A1* | 8/2018 | Tsujita | H01L 23/055 |
| 2018/0277395 A1* | 9/2018 | Masukawa | B32B 37/10 |
| 2018/0315721 A1* | 11/2018 | Sato | H01L 21/4875 |
| 2019/0035701 A1* | 1/2019 | Iwamoto | H01L 27/14636 |
| 2019/0304915 A1* | 10/2019 | Jain | H01L 28/20 |
| 2019/0385932 A1 | 12/2019 | Eid et al. | |
| 2019/0385933 A1* | 12/2019 | Eid | H01L 23/467 |
| 2020/0161202 A1* | 5/2020 | Lee | H01L 23/49827 |
| 2020/0168543 A1 | 5/2020 | Shih | |
| 2020/0227394 A1* | 7/2020 | Yeh | H01L 23/13 |
| 2020/0273839 A1* | 8/2020 | Elsherbini | H01L 23/49822 |
| 2020/0273840 A1* | 8/2020 | Elsherbini | H01L 24/17 |
| 2020/0321301 A1* | 10/2020 | Mitarai | H01L 23/3107 |
| 2020/0343213 A1* | 10/2020 | Takizawa | H01L 24/32 |
| 2020/0364600 A1* | 11/2020 | Elsherbini | H10N 60/805 |
| 2021/0043528 A1* | 2/2021 | Kim | C03C 3/093 |
| 2022/0093415 A1* | 3/2022 | Lin | H01L 23/15 |
| 2022/0130741 A1* | 4/2022 | Patil | H01L 23/13 |
| 2022/0149099 A1* | 5/2022 | Kakoiyama | H01L 23/15 |
| 2023/0189442 A1* | 6/2023 | Radhakrishnan | H05K 1/181 361/763 |

\* cited by examiner

CHIP PACKAGE STRUCTURE, PREPARATION METHOD, AND ELECTRONIC DEVICE

CROSS-REFERENCE TO RELATED APPLICATIONS

This application claims priority to Chinese Patent Application No. 202110010279.1, filed on Jan. 6, 2021 and Chinese Patent Application No. 202110436129.7 filed on Apr. 22, 2021, which are incorporated herein by reference in its entirety.

TECHNICAL FIELD

The embodiments relate to the field of chip package technologies, and in particular, to a chip package structure, a preparation method, and an electronic device.

BACKGROUND

A chip package structure is a structure formed after a die is packaged, and mainly includes the die and a glass substrate. The die is located on a surface of the glass substrate.

Currently, coefficients of thermal expansion of most glass substrates are far greater than a coefficient of thermal expansion of a die. Consequently, when a temperature inside the chip package structure is relatively high, a deformation of the glass substrate is relatively severe, and a stress at a connection point between the die and the glass substrate is relatively large. As a result, connection reliability between the die and the glass substrate is relatively low.

SUMMARY

A chip package structure, a preparation method, and an electronic device can address a problem in chip package technologies. The solutions are as follows:

According to one aspect, a chip package structure is provided, where the chip package structure includes a glass substrate, a routing layer, and at least one die; a first surface of the glass substrate has solder joints, a second surface of the glass substrate has substrate solder balls, the routing layer is located in the glass substrate, and the solder joints are electrically connected to the substrate solder balls by using the routing layer; and each die has chip solder balls, the at least one die is located on the first surface of the glass substrate, and the solder joints are bonded to the chip solder balls.

In an example, a substrate of the chip package structure is a glass substrate, and a coefficient of thermal expansion of the glass substrate is relatively close to a coefficient of thermal expansion of a die. Therefore, even when a temperature inside the chip package structure is relatively high, a deformation of the glass substrate is relatively close to a thermal expansion deformation of the die. This can reduce a stress at a connection point between the die and the glass substrate, thereby improving connection reliability between the die 3 and the glass substrate 1.

In addition, the glass substrate has high flatness and small warpage. This can further reduce a thermal expansion difference between the die and the glass substrate that is caused by a difference in coefficients of thermal expansion, and further improve the connection reliability between the die and the glass substrate.

The glass substrate features a small dielectric constant and a low dielectric loss rate. This can achieve a relatively small transmission loss of an electrical signal passing through the glass substrate.

In addition, because the glass substrate has a routing layer, an RDL (Redistribution Layer) may not be provided on the first surface or the second surface of the glass substrate. Further, an electrical signal between the die and a main board only needs to pass through the glass substrate. Therefore, because the electrical signal between the die and the main board does not need to pass through an RDL, the transmission loss of the electrical signal can be further reduced.

In a possible implementation, the glass substrate includes a plurality of glass layers; and there is at least one routing layer, and each routing layer is located between two adjacent glass layers.

In an example, the routing layer may be sandwiched between two adjacent glass layers, so that the routing layer is located in the glass substrate accordingly. In this assembly manner of first processing and manufacturing a glass layer with high flatness and then distributing a routing layer on a surface of the glass layer, an obtained glass substrate with a routing layer inside has relatively high flatness and small warpage. In addition, this manner can further reduce the thermal expansion difference between the die and the glass substrate that is caused by the difference in coefficients of thermal expansion, and further improve the connection reliability between the die and the glass substrate.

In a possible implementation, the first surface of the glass substrate has a groove; and there are a plurality of dies, some of the dies are located in the groove, and the other of the dies are located outside the groove.

In an example, when 3D packaging is performed on the glass substrate with the groove and the plurality of dies, all the dies are fastened to the first surface of the glass substrate in a flipping or attaching manner. No gold wire connection is required between the die and the glass substrate, thereby simplifying a packaging operation and reducing an occupation space of a gold wire.

In a possible implementation, the groove includes a groove bottom and n steps, and the n steps are located on two sides of the groove bottom, where n is a positive integer; and some of the dies are located in the groove are located on the groove bottom, and the other of the dies are located on an upper surface of an $i^{th}$ step in the n steps, where i is set to a value from 1 to n.

In an example, the glass substrate has a stepped groove, so that the glass substrate can be used to package more dies, thereby increasing a processing speed of the chip package structure.

In a possible implementation, each step includes a first sub-step and a second sub-step, and the first sub-step and the second sub-step are respectively located on the two sides of the groove bottom in opposite positions; and one end of the die on the upper surface of the $i^{th}$ step is located on an upper surface of the first sub-step, and the other end of the die is located on an upper surface of the second sub-step.

In an example, one end of the die on the upper surface of the $i^{th}$ step is located on the upper surface of the first sub-step, and the other end of the die is located on the upper surface of the second sub-step. The die covers the groove bottom from above, or the die covers the $i^{th}$ step from above. In this way, a die with a relatively small area or a die with a relatively large area can be mounted on the first surface of the glass substrate, thereby improving application flexibility of the glass substrate.

In a possible implementation, one end of the die outside the groove is located on a first side of the groove, and the other end of the die is located on a second side of the groove, and the first side and the second side of the groove are in opposite positions.

In an example, a die with a relatively small area may be mounted on the groove bottom, and a die with a relatively large area may be mounted outside the groove. In this way, a die with a relatively small area or a die with a relatively large area can be mounted on the glass substrate, thereby improving application flexibility of the glass substrate.

According to another aspect, a chip package structure preparation method is provided, where the method is applied to the chip package structure according to any one of the foregoing implementations, and the method includes: distributing a routing layer in a glass substrate, disposing solder joints on a first surface of the glass substrate, and disposing substrate solder balls on a second surface of the glass substrate, where the solder joints are electrically connected to the substrate solder balls by using the routing layer; disposing chip solder balls on a surface of each of at least one die; and fastening the at least one die to the first surface of the glass substrate, and bonding the solder joints to the chip solder balls.

In an example, a substrate of the chip package structure prepared by using the method is a glass substrate, and a coefficient of thermal expansion of the glass substrate is relatively close to a coefficient of thermal expansion of a die. Therefore, even when a temperature inside the chip package structure is relatively high, a deformation of the glass substrate is relatively close to a thermal expansion deformation of the die. This can reduce a stress at a connection point between the die and the glass substrate, thereby improving connection reliability between the die and the glass substrate.

In addition, the die is fastened to the first surface of the glass substrate in a flipping manner, and no gold wire connection is required between the die and the glass substrate, thereby simplifying a packaging operation and reducing an occupation space of a gold wire.

In a possible implementation, the glass substrate includes m glass layers, and m is a positive integer greater than 1; and the distributing a routing layer in a glass substrate includes: distributing a copper layer on a surface of a $k^{th}$ glass layer, and performing circuit printing on the copper layer to form the routing layer on the surface of the $k^{th}$ glass layer; and fastening a $(k+1)^{th}$ glass layer to a surface of the routing layer to obtain the glass substrate with the routing layer distributed between the two adjacent glass layers, where k is set to a value from 1 to m−1.

For example, if m is 3, and the 3 glass layers are respectively denoted as a first glass layer, a second glass layer, and a third glass layer, a copper layer is distributed on a surface of the first glass layer, and circuit printing is performed on the copper layer to form a routing layer on the surface of the first glass layer. The second glass layer is fastened to a surface of the routing layer on the surface of the first glass layer; and a copper layer is distributed on a surface of the second glass layer, and circuit printing is performed on the copper layer to form a routing layer on the surface of the second glass layer. The third glass layer is fastened to a surface of the routing layer on the surface of the second glass layer. In this way, a glass substrate with a routing layer distributed between every two adjacent glass layers is obtained.

In this assembly manner, the obtained glass substrate with a routing layer inside has relatively high flatness and small warpage. In addition, this manner can further reduce a thermal expansion difference between the die and the glass substrate that is caused by a difference in coefficients of thermal expansion, and further improve the connection reliability between the die and the glass substrate.

In a possible implementation, the first surface of the glass substrate has a groove, and there are a plurality of dies; and the fastening the at least one dies to the first surface of the glass substrate includes: fastening some of the plurality of dies in the groove, and fastening the other of the dies outside the groove.

In an example, when 3D packaging is performed on the glass substrate with the groove and the plurality of dies, all the dies are fastened to the first surface of the glass substrate in a flipping or attaching manner. No gold wire connection is required between the die and the glass substrate, thereby simplifying a packaging operation and reducing an occupation space of a gold wire.

In a possible implementation, the groove includes a groove bottom and n steps, and the n steps are located on two sides of the groove bottom, where n is a positive integer; and the fastening some of the plurality of dies in the groove includes: fastening some of the dies on the groove bottom; and fastening the other of the dies to an upper surface of an $i^{th}$ step in the n steps, where i is set to a value from 1 to n.

In an example, n may be 2, that is, the groove includes two steps. In this case, the fastening the dies in the groove may include: fastening some of the dies to the groove bottom of the groove, fastening one die to an upper surface of a first step, and fastening the other die to an upper surface of a second step.

In this way, the glass substrate can be used to package a relatively large quantity of dies, thereby increasing a processing speed of the chip package structure.

In a possible implementation, each step includes a first sub-step and a second sub-step, and the first sub-step and the second sub-step are respectively located on the two sides of the groove bottom in opposite positions; and the fastening the other of the dies to an upper surface of an $i^{th}$ step in the n steps includes: fastening one end of the die to an upper surface of the first sub-step of the $i^{th}$ step in the n steps, and fastening the other end of the die to an upper surface of the second sub-step of the $i^{th}$ step.

In an example, one end of the die on the upper surface of the first step may be located on the upper surface of the first sub-step of the first step, and the other end may be located on the upper surface of the second sub-step of the first step. This manner of arranging dies is advantageous in fastening a die with a large area to the surface of the glass substrate.

In a possible implementation, the fastening the other of the dies outside the groove includes: fastening one end of the die to a first side of the groove, and fastening the other end of the die to a second side of the groove, where the first side and the second side of the groove are in opposite positions.

In an example, one end of a die outside the groove is located on the first side of the groove, and the other end of the die is located on the second side of the groove. This manner of arranging dies is advantageous in fastening a die with a large area to the surface of the glass substrate.

According to still another aspect, an electronic device is provided, where the electronic device includes the foregoing chip package structure.

The electronic device includes a main board and the foregoing chip package structure. The chip package structure is located on a surface of the main board, and substrate solder balls of a glass substrate in the chip package structure are bonded to solder joints on the surface of the main board.

As described above, a substrate configured to bear a die in the chip package structure is a glass substrate of a glass material. A coefficient of thermal expansion of glass is relatively close to a coefficient of thermal expansion of the die. In addition, the coefficient of thermal expansion of the glass may be adjusted by adjusting composition proportions of the glass during glass preparation, so that the coefficient of thermal expansion of the glass is close to the coefficient of thermal expansion of the die. If the coefficient of thermal expansion of the glass substrate is close to that of the die, a thermal expansion difference caused by a relatively large difference in the coefficients of thermal expansion can be reduced, thereby improving the connection reliability between the die and the glass substrate.

In addition, because the routing layer is located in the glass substrate, no RDL needs to be disposed or only a few RDLs need to be disposed on an outer surface of the glass substrate, such as the first surface or the second surface. In this way, an electrical signal transmitted between the chip solder balls of the die and the substrate solder balls of the glass substrate mainly passes through the glass substrate. The glass substrate features a small dielectric constant and a low dielectric loss rate, and this can reduce a transmission loss in electrical signal transmission.

DETAILED DESCRIPTION OF THE EMBODIMENTS

An embodiment provides a chip package structure. The chip package structure is a structure formed after a die is packaged, and the die may also be referred to as a die.

Figure 1:
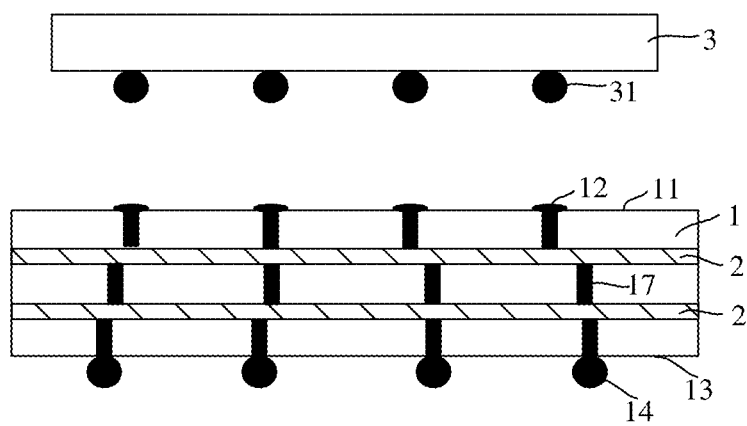
FIG. 1 is a schematic diagram of an exploded structure of a chip package structure.

As shown in FIG. 1, the chip package structure includes a glass substrate 1, a routing layer 2, and at least one die 3. A first surface 11 of the glass substrate 1 has solder joints 12, a second surface 13 of the glass substrate 1 has substrate solder balls 14, the first surface 11 and the second surface 13 of the glass substrate 1 are in opposite positions, and there are a plurality of solder joints 12 and a plurality of substrate solder balls 14.

The solder joints 12 may also be referred to as pads and are configured to be physically and electrically connected to the die 3. The substrate solder balls 14 may also be referred to as solder balls, projections, or the like, and are configured to be physically and electrically connected to a main board of an electronic device in which the chip package structure is located.

As shown in FIG. 1, the routing layer 2 is located in the glass substrate 1, the routing layer 2 is a metal layer with a printed circuit, and the routing layer 2 is configured to implement electrical connections between the solder joints 12 and the substrate solder balls 14. For example, as shown in FIG. 1, the glass substrate 1 further has a through hole 17 in a thickness direction, and the through hole 17 has a conductive medium. In this way, the solder joints 12 can be electrically connected to the substrate solder balls 14 by using the conductive medium in the through hole 17 and the routing layer 2.

Figure 2:
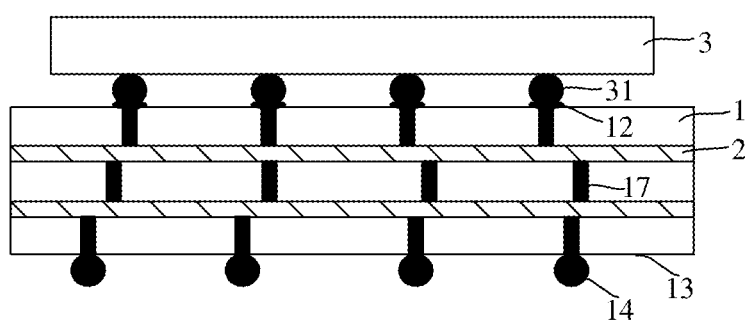
FIG. 2 is a schematic diagram of a structure of a chip package structure.

As shown in FIG. 2, a surface of each die 3 has chip solder balls 31. The chip solder balls 31 may also be referred to as solder balls, projections, or the like, and are configured to be physically and electrically connected to the glass substrate 1. The die 3 is located on the first surface 11 of the glass substrate 1, and the chip solder balls 31 of the die 3 are attached to the solder joints 12 of the glass substrate 1, so as to implement a fixed connection between the die 3 and the glass substrate 1 and electrical connections between the chip solder balls 31 and the solder joints 12. Because there are also electrical connections between the solder joints 12 and the substrate solder balls 14, the routing layer 2 in the glass substrate 1 enables re-layout of an I/O port of the die 3, and enables the I/O port to be arranged on the second surface 13 of the glass substrate 1, that is, the routing layer 2 in the glass substrate 1 enables re-layout of the chip solder balls 31 of the die 3 as the substrate solder balls 14 of the glass substrate 1. The substrate solder balls 14 are configured to be connected to the main board of the electronic device in which the chip package structure is located.

A substrate of the chip package structure is a glass substrate 1 and a coefficient of thermal expansion of the glass substrate 1 is relatively close to a coefficient of thermal expansion of the die 3. Therefore, even when a temperature inside the chip package structure is relatively high, a deformation of the glass substrate 1 is relatively close to a thermal expansion deformation of the die 3. This can reduce a stress at a connection point between the die 3 and the glass substrate 1, thereby improving connection reliability between the die 3 and the glass substrate 1.

In addition, the glass substrate 1 has high flatness and small warpage. This can further reduce a thermal expansion difference between the die 3 and the glass substrate 1 that is caused by a difference in the coefficients of thermal expansion, and further improve the connection reliability between the die 3 and the glass substrate 1.

The glass substrate 1 features a small dielectric constant and a low dielectric loss rate. This can achieve a relatively small transmission loss of an electrical signal passing through the glass substrate 1.

In addition, because the glass substrate 1 has the routing layer 2, an RDL (Redistribution Layer) may not be provided on the first surface 11 or the second surface 13 of the glass substrate 1. Further, an electrical signal between the die 3 and the main board only needs to pass through the glass substrate 1. Therefore, because the electrical signal between the die 3 and the main board does not need to pass through an RDL, the transmission loss of the electrical signal can be further reduced.

An RDL may also be provided on a surface of the glass substrate 1. However, because the glass substrate 1 already has the routing layer 2, a quantity of RDLs may be relatively small. When the quantity of RDLs is relatively small, the transmission loss of the electrical signal is also relatively small.

In an example, there may be a plurality of routing layers 2, and the plurality of routing layers 2 are located in the glass substrate 1. For example, the plurality of routing layers 2 may be stacked and located in the glass substrate 1. For another example, the plurality of routing layers 2 may be spaced and located in the glass substrate 1.

In an example, the routing layer 2 may be built in the glass substrate 1 before the glass substrate 1 is formed by solidification, so that the routing layer 2 is located in the glass substrate 1. In this implementation, processing and preparation are simple, thereby improving processing and manufacturing efficiency of the chip package structure.

Figure 3:
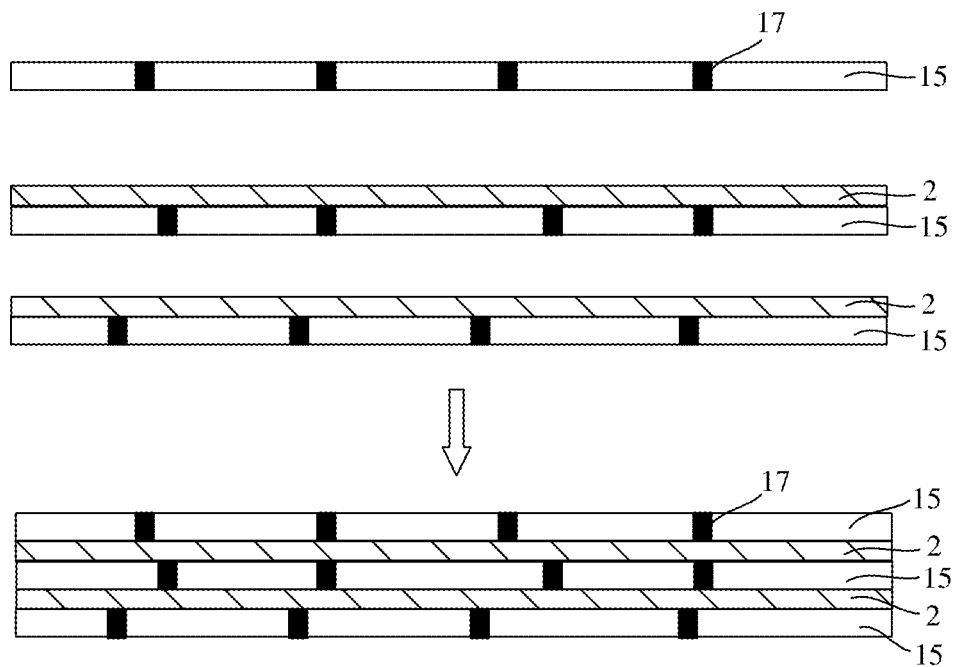
FIG. 3 is a schematic diagram of a structure of a glass substrate in a chip package structure.

In another example, as shown in FIG. 3, the glass substrate 1 may include a plurality of glass layers 15, and the routing layer 2 is located in the glass substrate 1. This may be implemented by locating the routing layer 2 between two adjacent glass layers 15. In this implementation, a glass layer 15 with high flatness is first prepared and then a routing layer 2 is distributed on a surface of the glass layer 15, so that an obtained glass substrate 1 with the routing layer 2 inside has relatively high flatness and small warpage. In addition, this implementation can further reduce the thermal expansion difference between the die 3 and the glass substrate 1 that is caused by the difference in the coefficients of thermal expansion, and further improve the connection reliability between the die 3 and the glass substrate 1.

A quantity of glass layers 15 may be flexibly selected based on an actual situation. Thicknesses of the plurality of glass layers 15 may be equal or unequal, and the thicknesses of the glass layers 15 each may be set to a value from 20 μm to 100 μm.

A quantity of routing layers 2 may also be flexibly selected based on an actual situation. For example, the quantity of routing layers 2 is 1 or above. Thicknesses of these routing layers 2 may be equal or unequal, and the thicknesses of these routing layers 2 each may be set to a value from 0.5 μm to 4 μm.

Further, a plurality of routing layers 2 may alternatively be distributed between two adjacent glass layers 15. For example, two or more routing layers 2 are stacked and located between two adjacent glass layers 15.

As shown in FIG. 3, there are three glass layers 15, at least one routing layer 2 may be distributed between a first glass layer and a second glass layer, and at least one routing layer 2 may be distributed between the second glass layer and a third glass layer.

A specific quantity of the glass layers 15 and that of the routing layers 2 are not limited in this embodiment and may be flexibly selected based on an actual situation. In addition, an implementation of locating the routing layer 2 in the glass substrate 1 is not limited in this embodiment, so that the routing layer 2 can be located in the glass substrate 1.

Figure 4:
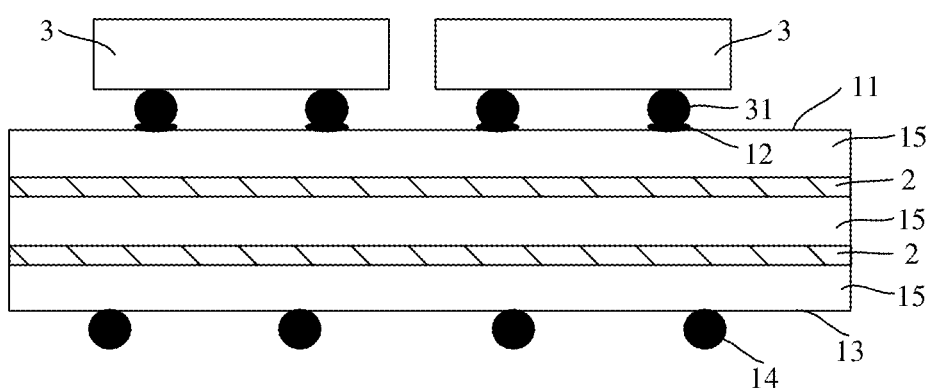
FIG. 4 is a schematic diagram of a structure of a chip package structure.

In an example, as shown in FIG. 2, the die 3 may be fastened to the first surface 11 of the glass substrate 1 in a 2D packaging manner. As shown in FIG. 4, there are a plurality of dies 3, and the plurality of dies 3 may alternatively be fastened to the first surface 11 of the glass substrate 1 in a 2.5D packaging manner.

Figure 5:
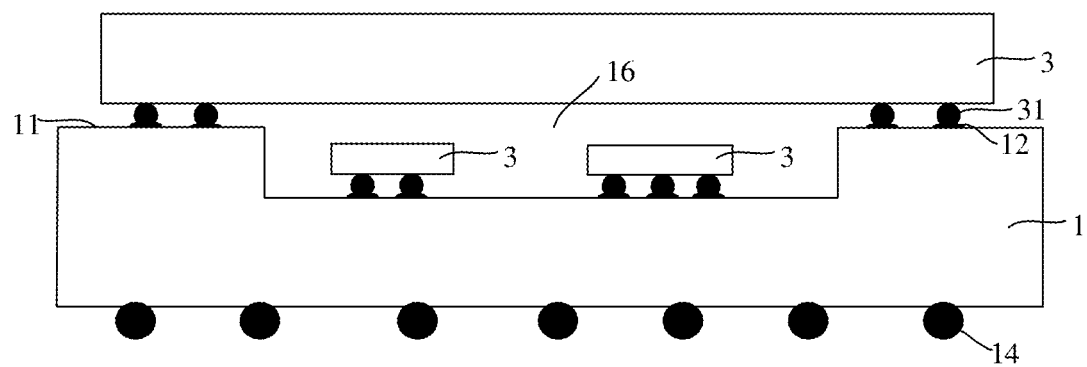
FIG. 5 is a schematic diagram of a structure of a chip package structure.

In some other examples, the plurality of dies 3 may alternatively be fastened to the first surface 11 of the glass substrate 1 in a 3D packaging manner. Accordingly, as shown in FIG. 5, the first surface 11 of the glass substrate 1 may have a groove 16, and there are a plurality of dies 3. In the plurality of dies 3, some of the dies 3 may be located in the groove 16, and some other of the dies 3 may be located outside the groove 16.

For example, as shown in FIG. 5, two dies 3 may be mounted in the groove 16, and the two dies 3 are located in parallel on a groove bottom of the groove 16. One die 3 may be mounted outside the groove 16. One end of the die 3 is located on a first side (a left side in FIG. 5) of the groove 16, and the other end is located on a second side (a right side in FIG. 5) of the groove 16. The die 3 outside the groove 16 covers a groove opening of the groove 16 from above.

A routing layer 2 also exists inside the glass substrate 1 in FIG. 5. To better illustrate a feature of the groove 16 of the glass substrate 1, the routing layer 2 inside is not shown.

Figure 6:
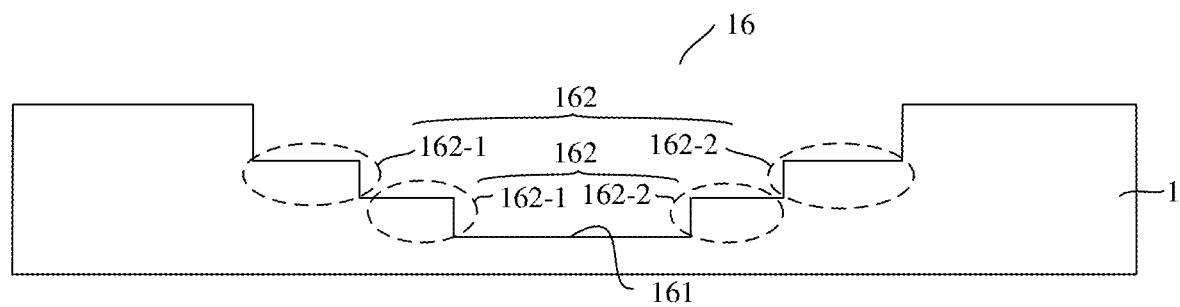
FIG. 6 is a schematic diagram of a structure of a glass substrate in a chip package structure.
Figure 7:
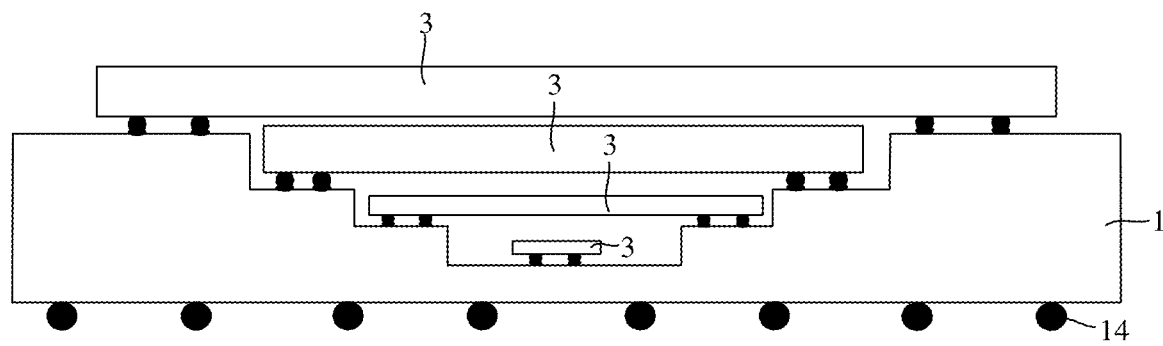
FIG. 7 is a schematic diagram of a structure of a chip package structure.

In some other examples, to mount a relatively large quantity of dies 3 in the 3D package to increase a processing speed of the chip package structure, as shown in FIG. 6, the groove 16 includes a groove bottom 161 and n steps 162 accordingly, where n is a positive integer. As shown in FIG. 7, some of the plurality of dies 3 are located on the groove bottom 161, some of the dies 3 are located on an upper surface of an $i^{th}$ step 162, and the other of the dies 3 are located outside the groove 16, where i is set to a value from 1 to n. For example, if n is 2, some of the dies 3 are located on an upper surface of a first step 162, and some of the dies 3 are located on an upper surface of a second step 162.

As shown in FIG. 6, each step 162 includes a first sub-step 162-1 and a second sub-step 162-2, where the first sub-step 162-1 is located on a first side of the groove bottom 161, and the second sub-step 162-2 is located on a second side of the groove bottom 161.

Therefore, the die 3 may be located on the upper surface of the $i^{th}$ step 162 in at least the following two manners: In one manner, as shown in FIG. 7, one end of the die 3 on the upper surface of the $i^{th}$ step 162 is located on an upper surface of the first sub-step 162-1 and the other end of the die 3 is located on an upper surface of the second sub-step 162-2. The die 3 covers the groove bottom 161 from above, or the die 3 covers an $(i-1)^{th}$ step from above.

Figure 8:
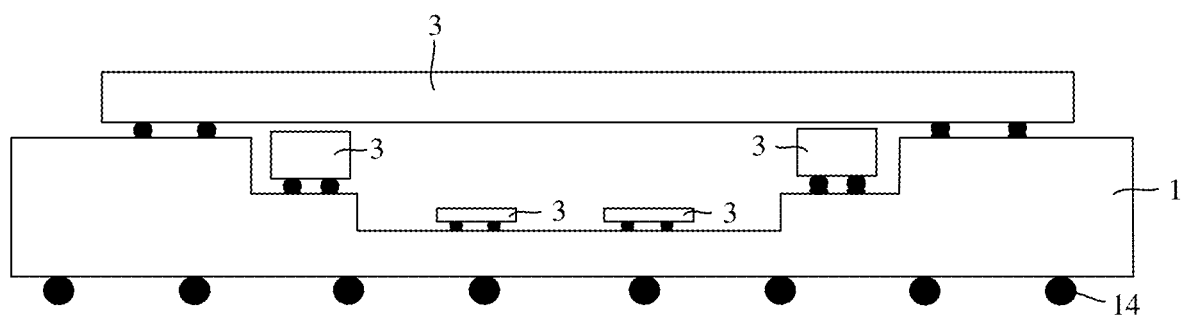
FIG. 8 is a schematic diagram of a structure of a chip package structure.

In the other manner, as shown in FIG. 8, one die 3 is separately mounted on the upper surface of the first sub-step 162-1 of the $i^{th}$ step 162, and another die 3 is separately mounted on the upper surface of the first sub-step 162-1 of the $i^{th}$ step 162.

Similarly, the die 3 outside the groove 16 may also be mounted in at least two manners: In one manner, one end of the die 3 is located on a first side of the groove 16, and the other end of the die 3 is located on a second side of the groove 16. The die 3 covers the n steps 162 from above. In the other manner, one die 3 is separately mounted on the first side of the groove 16, and another die 3 is separately mounted on the second side of the groove 16. The two dies 3 are independent of each other with respect to a positional relationship.

It may further be understood that a die 3 with a relatively small area or a die 3 with a relatively large area can be mounted on the first surface 11 of the glass substrate 1. For example, a die 3 with a relatively small area is mounted on the groove bottom of the groove 16, and a die 3 with a relatively large area may be separately mounted on the upper surface of the step 162 and outside the groove 16, thereby improving application flexibility of the glass substrate 1.

In this embodiment, a distribution of the dies 3 on an upper surface of each step 162 and outside the groove 16 is not limited and may be flexibly selected based on an actual situation.

Based on the stacking manners shown in FIG. 5 to FIG. 8, the dies 3 each may be fastened to the first surface 11 of the glass substrate 1 in a flipping or attaching manner, and no gold wire connection is required between each of the dies 3 and the glass substrate 1, thereby simplifying a packaging operation and reducing an occupation space of a gold wire. In addition, due to the stepped groove 16, a height of the step 162 may be increased, so that two vertically adjacent dies 3 are not in contact with each other, and there may even be a specific distance in between. This is conducive to heat dissipation of the dies 3.

Figure 9:
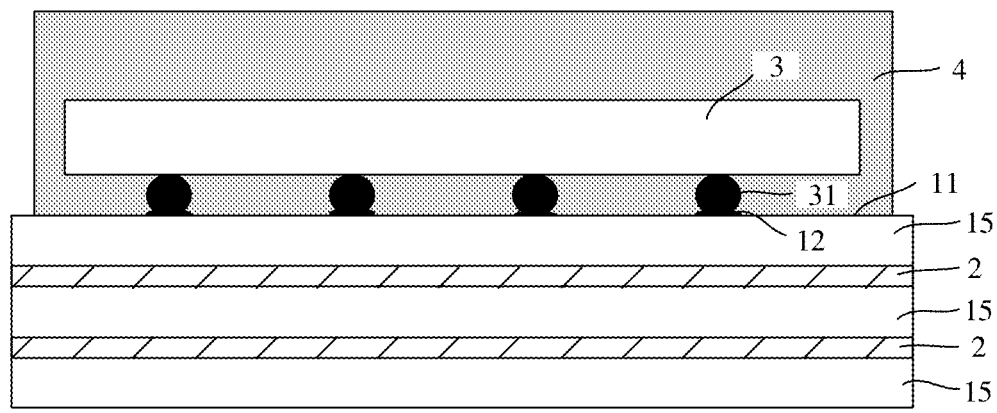
FIG. 9 is a schematic diagram of a structure of a chip package structure.

In an example, to protect the die 3, as shown in FIG. 9, the chip package structure further includes a package body 4 accordingly, and the package body 4 surrounds at least one die 3 and the first surface 11 of the glass substrate 1.

For example, after at least one die 3 is fastened to the first surface 11 of the glass substrate 1, the first surface 11 of the glass substrate 1 may be covered by a tool cover. The tool cover covers the die 3 on the first surface 11. Then, an adhesive material is filled into the tool cover, and the adhesive material is solidified to form the package body 4. The package body 4 packages the die 3 inside, and then the tool cover is removed to obtain the chip package structure including the package body 4.

A size of the package body 4 matches a size of the first surface 11 of the glass substrate 1. For example, the package body 4 may fully enclose the first surface 11 of the glass substrate 1, and the package body 4 may alternatively partially enclose the first surface 11 of the glass substrate 1. This is not limited in this embodiment and may be flexibly selected based on an actual situation.

In this embodiment, a substrate configured to bear a die 3 in the chip package structure is a glass substrate 1 of a glass material. A coefficient of thermal expansion of glass is relatively close to a coefficient of thermal expansion of the die 3. In addition, the coefficient of thermal expansion of the glass may be adjusted by adjusting composition proportions of the glass during glass preparation, so that the coefficient of thermal expansion of the glass is close to the coefficient of thermal expansion of the die 3. If the coefficient of thermal expansion of the glass substrate 1 is close to that of the die 3, a thermal expansion difference caused by a relatively large difference in the coefficients of thermal expansion can be reduced, thereby improving the connection reliability between the die 3 and the glass substrate 1.

In addition, because the routing layer 2 is located in the glass substrate 1, no RDL needs to be disposed or only a few RDLs need to be disposed on an outer surface of the glass substrate 1, such as the first surface or the second surface. In this way, an electrical signal transmitted between the chip solder balls 31 of the die 3 and the substrate solder balls 14 of the glass substrate 1 mainly passes through the glass substrate 1. The glass substrate features a small dielectric constant and a low dielectric loss rate, and this can reduce a transmission loss in electrical signal transmission.

Figure 10:
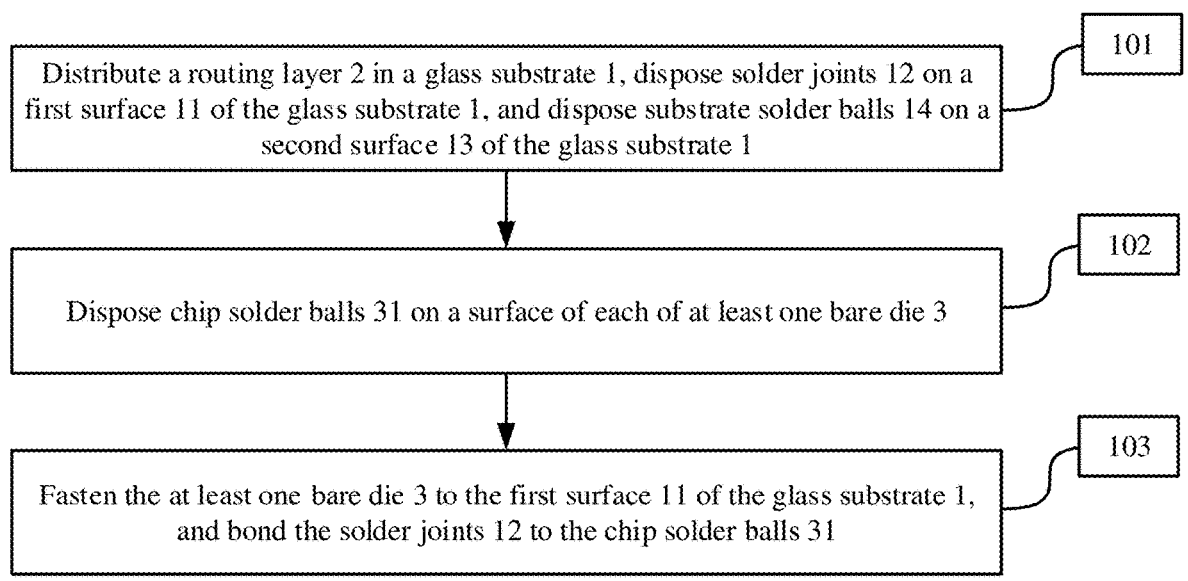
FIG. 10 is a schematic flowchart of a chip package structure preparation method.

An embodiment further provides a chip package structure preparation method, and the method is used to prepare the foregoing chip package structure. The method may be performed based on a process shown in FIG. 10:

The following steps do not represent a sequence. In a preparation, the method may be performed based on the following sequence of steps, or another preparation sequence may be selected based on an actual situation.

In step 101, a routing layer 2 is distributed in a glass substrate 1, solder joints 12 are disposed on a first surface 11 of the glass substrate 1, and substrate solder balls 14 are disposed on a second surface 13 of the glass substrate 1.

The solder joints 12 are electrically connected to the substrate solder balls 14 by using the routing layer 2.

There may be one or more routing layers 2.

For example, a plurality of routing layers 2 are stacked and located in the glass substrate 1, or a plurality of routing layers 2 are spaced and located in the glass substrate 1. A quantity of routing layers 2 is not limited in this embodiment.

An implementation of distributing the routing layer 2 in the glass substrate 1 may be as follows: As shown in FIG. 3, the glass substrate 1 includes m glass layers 15, and m is a positive integer greater than 1. First, a copper layer is distributed on a surface of a $k^{th}$ glass layer 15, and circuit printing is performed on the copper layer to form a routing layer 2 on the surface of the $k^{th}$ glass layer 15. Then, a $(k+1)^{th}$ glass layer 15 is fastened to a surface of the routing layer 2 to obtain a glass substrate 1 with the routing layer 2 distributed between the two adjacent glass layers 15, where k is set to a value from 1 to (m−1).

In an example, a manner of forming the routing layer 2 on the surface of the glass layer 15 may be as follows: First, copper is coated on the surface of the glass layer 15 in at least one manner of deposition, electroplating, chemical plating, and calendering; then, screen printing is performed, and photosensitive ink is coated on a silk screen; afterwards, ultraviolet curing is performed; and next, etching and ink removal cleaning are performed to obtain the routing layer 2 distributed on the surface of the glass layer 15. Screen printing is to prepare a pre-designed circuit diagram into a silk screen mask.

In another example, another manner of forming the routing layer 2 on the surface of the glass layer 15 may be implemented by using a Damascus technique. For example, the routing layer 2 is obtained on the surface of the glass layer 15 by first etching a pattern used for a metal conducting wire on the surface of the glass layer 15, and then filling metal.

A manner of forming the routing layer 2 on the surface of the glass layer 15 is not limited in this embodiment and may be flexibly selected based on an actual situation.

Regardless of which manner is used to form the routing layer 2 on the surface of the glass layer 15, a line spacing between lines and a line width of each line in the routing layer 2 may be flexibly arranged. For example, both the line spacing and the line width in the routing layer 2 may be greater than 2 μm.

In this way, the routing layer 2 is formed on a surface of each glass layer 15, and glass layers 15 covered with the routing layer 2 are stacked and fastened, so that the glass substrate 1 with the routing layers 2 inside can be obtained.

In the following, three glass layers 15 are used as examples to describe a manner of obtaining the glass substrate 1 with the routing layers 2 inside. The three glass layers 15 are respectively denoted as a first glass layer 15, a second glass layer 15, and a third glass layer 15.

For example, as shown in FIG. 3, the manner of obtaining the glass substrate 1 with the routing layers 2 inside may be as follows: A routing layer 2 is separately prepared on surfaces of two glass layers 15. For example, a routing layer 2 is first separately prepared on surfaces of the first glass layer 15 and the second glass layer 15, and then the first glass layer 15, the second glass layer 15, and the third glass layer 15 are stacked and fastened, and the routing layer 2 is located between two adjacent glass layers 15.

For another example, another manner of obtaining the glass substrate 1 with the routing layers 2 inside may be as follows: First, a routing layer 2 is separately prepared on a surface of the first glass layer 15, and then the second glass layer 15 is fastened to a surface of the foregoing routing layer 2. Then, a routing layer 2 is prepared on a surface of the second glass layer 15, and then the third glass layer 15 is fastened to a surface of the routing layer 2 on the surface of the second glass layer 15.

A manner of obtaining the glass substrate 1 with the routing layers 2 inside is not limited in this embodiment and may be flexibly selected based on an actual situation.

In an example, the routing layer 2 may be bonded and fastened to the glass layer 15 by using a polymer material, and the polymer material may be PI (polyimide), BCB (benzocyclobutene), or the like.

To ensure a secure connection between the glass layer 15 and the routing layer 2, and to avoid excessively increasing a thickness of the glass substrate 1, accordingly, a thickness of a bonding layer between the glass layer 15 and the routing layer 2 may range from 5 μm to 50 μm.

In another example, if an area of the routing layer 2 is less than an area of the glass layer 15, two adjacent glass layers 15 may alternatively be bonded and fastened by using a polymer material.

It should be noted that, as shown in FIG. 3, each glass layer 15 has a through hole 17 in a thickness direction, and the through hole 17 has a conductive medium, where the conductive medium may be copper. A manner of filling the through hole 17 with the conductive medium may be a combination of one or more of electroplating, deposition, chemical plating, and nanoparticle sintering.

In an example, before the routing layer 2 is distributed on the surface of the glass layer 15, perforation processing may be performed on the glass layer 15 first. For example, perforation processing may be performed in a lasing manner, an etching manner, or a manner of combining lasing and etching.

A diameter of each through hole 17 may be set to a value from 5 μm to 100 μm.

After the glass layer 15 is provided with the through hole 17 in the thickness direction, the through hole 17 is filled with the conductive medium. The conductive medium may be copper. For example, the through hole 17 may be filled with copper by using a combination of one or more of electroplating, deposition, chemical plating, and nanoparticle sintering.

In an example, after the m glass layers 15 are stacked and fastened together, as shown in FIG. 3, positions of through holes 17 in two adjacent glass layers 15 may be aligned with or staggered from each other, which is not limited in this embodiment.

Another manner of distributing the routing layer 2 in the glass substrate 1 may be as follows: The routing layer 2 may be built in the glass substrate 1. For example, during processing of the glass substrate 1, a metal layer may be distributed in a glass liquid in a melting step, and circuit printing is performed on the metal layer to form the routing layer 2 on a surface of the glass liquid. After the glass liquid is molded, the routing layer 2 is built in the glass substrate 1.

An implementation of distributing the routing layer 2 in the glass substrate 1 is not limited in this embodiment, provided that the routing layer 2 can be located in the glass substrate 1.

In step 102, chip solder balls 31 are disposed on a surface of each of at least one die 3.

In an example, after a die 3 is processed, chip solder balls 31 can be formed on a surface of the die 3 as an I/O port of the die 3.

In step 103, the at least one die 3 is fastened to the first surface 11 of the glass substrate 1, and the solder joints 12 are bonded to the chip solder balls 31.

In an example, the die 3 is fastened to the first surface 11 of the glass substrate 1 in a flipping manner, that is, a surface with chip solder balls 31 of the die 3 is in a position opposite to that of the first surface 11 of the glass substrate 1. In this way, the chip solder balls 31 of the die 3 may be welded to the solder joints 12 on the first surface 11 of the glass substrate 1, so as to implement a physical connection and an electrical connection between the die 3 and the glass substrate 1.

Accordingly, the first surface 11 of the glass substrate 1 has a groove 16, so that 3D packaging of the die 3 can still be implemented in the flipping or attaching manner.

In an example, there are a plurality of dies 3. A process of fastening the plurality of dies 3 to the first surface 11 of the glass substrate 1 may be as follows: fastening some of the plurality of dies 3 in the groove 16 and fastening the other of the dies 3 outside the groove 16.

For example, as shown in FIG. 5, some of the dies 3 are fastened to a groove bottom of the groove 16, and the other of the dies 3 each have one end located on a first side of the groove 16, and have the other end located on a second side of the groove 16.

For another example, some of the dies 3 are fastened to the groove bottom of the groove 16, some of the dies 3 are located on the first side of the groove 16, and the other of the dies 3 are located on the second side of the groove 16.

For more dies 3 to be mounted in a 3D package, accordingly, the groove 16 includes a groove bottom 161 and n steps 162, and the n steps 162 are located on two sides of the groove bottom 161, where n is a positive integer. In this way, the process of fastening the plurality of dies 3 to the first surface 11 of the glass substrate 1 may be as follows: fastening some of the dies 3 outside the groove 16, fastening some of the dies 3 to the groove bottom of the groove 16, and fastening some of the dies 3 to an upper surface of an $i^{th}$ step 162 in the n steps 162, where i is set to a value from 1 to n. That is, the dies 3 are fastened outside the groove 16, to the groove bottom of the groove 16, and to an upper surface of each step 162. In this way, a relatively large quantity of dies 3 can be mounted on the glass substrate 1, and all the dies 3 are fastened to the first surface 11 of the glass substrate 1 in the flipping manner.

Each step 162 includes a first sub-step 162-1 and a second sub-step 162-2, and the first sub-step 162-1 and the second sub-step 162-2 are respectively located on the two sides of the groove bottom 161 in opposite positions.

A process of fastening the die 3 to the upper surface of the $i^{th}$ step 162 may be as follows: fastening one end of the die 3 to an upper surface of the first sub-step 162-1 of the $i^{th}$ step 162 in the n steps 162 and fastening the other end of the die 3 to an upper surface of the second sub-step 162-2 of the $i^{th}$ step 162.

Similarly, a process of fastening the die 3 outside the groove 16 may be as follows: fastening one end of the die 3 to the first side of the groove 16 and fastening the other end of the die 3 to the second side of the groove 16, where the first side and the second side of the groove 16 are in opposite positions.

According to the chip package structure prepared by using the foregoing method, a substrate configured to bear a die 3 in the chip package structure is a glass substrate 1 of a glass material. A coefficient of thermal expansion of glass is relatively close to a coefficient of thermal expansion of the die 3. In addition, the coefficient of thermal expansion of the glass may be adjusted by adjusting composition proportions of the glass during glass preparation, so that the coefficient of thermal expansion of the glass is close to the coefficient of thermal expansion of the die 3. If the coefficient of thermal expansion of the glass substrate 1 is close to that of the die 3, a thermal expansion difference caused by a relatively large difference in the coefficients of thermal expansion can be reduced, thereby improving the connection reliability between the die 3 and the glass substrate 1.

In addition, because the routing layer 2 is located in the glass substrate 1, no RDL needs to be disposed or only a few RDLs need to be disposed on an outer surface of the glass substrate 1, such as the first surface or the second surface. In this way, an electrical signal transmitted between the chip solder balls 31 of the die 3 and the substrate solder balls 14 of the glass substrate 1 mainly passes through the glass substrate 1. The glass substrate 1 features a small dielectric constant and a low dielectric loss rate, and this can reduce a transmission loss in electrical signal transmission.

An embodiment further provides an electronic device. The electronic device includes a main board and the foregoing chip package structure. The chip package structure is located on a surface of the main board, and substrate solder balls of a glass substrate 1 in the chip package structure are bonded to solder joints on the surface of the main board.

As described above, a substrate configured to bear a die 3 in the chip package structure is a glass substrate 1 of a glass material. A coefficient of thermal expansion of glass is relatively close to a coefficient of thermal expansion of the die 3. In addition, the coefficient of thermal expansion of the glass may be adjusted by adjusting composition proportions of the glass during glass preparation, so that the coefficient of thermal expansion of the glass is close to the coefficient of thermal expansion of the die 3. If the coefficient of thermal expansion of the glass substrate 1 is close to that of the die 3, a thermal expansion difference caused by a relatively large difference in the coefficients of thermal expansion can be reduced, thereby improving the connection reliability between the die 3 and the glass substrate 1.

In addition, because the routing layer 2 is located in the glass substrate 1, no RDL needs to be disposed or only a few RDLs need to be disposed on an outer surface of the glass substrate 1, such as the first surface or the second surface. In this way, an electrical signal transmitted between the chip solder balls 31 of the die 3 and the substrate solder balls 14 of the glass substrate 1 mainly passes through the glass substrate 1. The glass substrate 1 features a small dielectric constant and a low dielectric loss rate, and this can reduce a transmission loss in electrical signal transmission.

The foregoing description is merely an embodiment, but is not intended to limit. Any modification, equivalent replacement, or improvement made without departing from the principle should fall within the protection scope.

What is claimed is:

1. A chip package structure comprising:
   a glass substrate comprising a plurality of glass layers, wherein a first surface of the glass substrate has solder joints and a second surface of the glass substrate has substrate solder balls;
   a plurality of routing layers, wherein each routing layer is distributed between two adjacent glass layers in the glass substrate and the solder joints are electrically connected to the substrate solder balls by using each routing layer; and
   a plurality of dies, wherein a gap is defined between vertically adjacent dies of the plurality of dies, each die has chip solder balls and is located on the first surface of the glass substrate, and the solder joints are bonded to the chip solder balls.

2. The chip package structure according to claim 1, wherein the first surface of the glass substrate has a groove, some dies of the plurality of dies are located in the groove, and other dies of the plurality of dies are located outside the groove.

3. The chip package structure according to claim 2, wherein the groove comprises a groove bottom and n steps, the n steps are located on two sides of the groove bottom, n is a positive integer, some dies of the plurality of dies in the groove are located on the groove bottom, and the other dies of the plurality of dies are located on an upper surface of an $i^{th}$ step in the n steps, wherein i is set to a value from 1 to n.

4. The chip package structure according to claim 3, wherein each step comprises a first sub-step and a second sub-step, the first sub-step and the second sub-step are respectively located on the two sides of the groove bottom in opposite positions and one end of each die on the upper surface of the $i^{th}$ step is located on an upper surface of the first sub-step, and the other end of each die is located on an upper surface of the second sub-step.

5. The chip package structure according to claim 2, wherein one end of each die outside the groove is located on a first side of the groove, the other end of each die is located on a second side of the groove, and the first side and the second side of the groove are in opposite positions.

6. A method comprising:
   distributing a plurality of routing layers in a glass substrate comprising a plurality of glass layers, wherein each routing layer is distributed between two adjacent glass layers;
   disposing solder joints on a first surface of the glass substrate;
   disposing substrate solder balls on a second surface of the glass substrate, wherein the solder joints are electrically connected to the substrate solder balls by using each routing layer;
   disposing chip solder balls on a surface of each die of a plurality of dies;
   fastening the plurality of dies to the first surface of the glass substrate, wherein a gap is defined between vertically adjacent dies of the plurality of dies; and
   bonding the solder joints to the chip solder balls.

7. The method according to claim 6, wherein the glass substrate comprises m glass layers, m is a positive integer greater than 1, and distributing each routing layer in the glass substrate further comprises:
   distributing a copper layer on a surface of a $k^{th}$ glass layer;
   performing circuit printing on the copper layer to form each routing layer on the surface of the $k^{th}$ glass layer; and
   fastening a $(k+1)^{th}$ glass layer to a surface of each routing layer to obtain the glass substrate wherein k is set to a value from 1 to m−1.

8. The method according to claim 6, wherein the first surface of the glass substrate has a groove and the fastening of the plurality of dies to the first surface of the glass substrate further comprises:
   fastening some dies of the plurality of dies in the groove; and
   fastening other dies of the plurality of dies outside the groove.

9. The method according to claim 8, wherein the groove comprises a groove bottom and n steps, the n steps are located on two sides of the groove bottom, n is a positive integer, and fastening some dies of the plurality of dies in the groove further comprises:

fastening some dies of the plurality of dies on the groove bottom; and fastening the other dies of the plurality of dies to an upper surface of an $i^{th}$ step in the n steps, wherein i is set to a value from 1 to n.

10. The method according to claim 9, wherein each step comprises a first sub-step and a second sub-step, the first sub-step and the second sub-step are respectively located on the two sides of the groove bottom in opposite positions, fastening the other dies of the plurality of dies to the upper surface of the $i^{th}$ step in the n steps further comprises:

fastening one end of each die to an upper surface of the first sub-step of the $i^{th}$ step in the n steps; and fastening the other end of each die to an upper surface of the second sub-step of the $i^{th}$ step.

11. The method according to claim 8, wherein the fastening of the other dies of the plurality of dies outside the groove comprises:

fastening one end of the die to a first side of the groove; and fastening the other end of the die to a second side of the groove, wherein the first side and the second side of the groove are in opposite positions.

12. An electronic device comprising a chip package structure, and the chip package structure comprises:

a glass substrate comprising a plurality of glass layers, wherein a first surface of the glass substrate has solder joints and a second surface of the glass substrate has substrate solder balls;

a plurality of routing layers, wherein each routing layer is distributed between two adjacent glass layers in the glass substrate and the solder joints are electrically connected to the substrate solder balls by using each routing layer; and a plurality of dies, wherein a gap is defined between vertically adjacent dies of the plurality of dies, each die has chip solder balls and is located on the first surface of the glass substrate, and the solder joints are bonded to the chip solder balls.

13. The electronic device according to claim 12, wherein the first surface of the glass substrate has a groove, some dies of the plurality of dies are located in the groove, and other dies of the plurality of dies are located outside the groove.

14. The electronic device according to claim 13, wherein the groove comprises a groove bottom and n steps, the n steps are located on two sides of the groove bottom, n is a positive integer, and some dies of the plurality of dies in the groove are located on the groove bottom, and the other dies of the plurality of dies are located on an upper surface of an $i^{th}$ step in the n steps, wherein i is set to a value from 1 to n.

15. The electronic device according to claim 14, wherein each step comprises a first sub-step and a second sub-step, and the first sub-step and the second sub-step are respectively located on the two sides of the groove bottom in opposite positions, one end of each die on the upper surface of the $i^{th}$ step is located on an upper surface of the first sub-step, and the other end of each die is located on an upper surface of the second sub-step.

16. The electronic device according to claim 13, wherein the one end of each die outside the groove is located on a first side of the groove, the other end of each die is located on a second side of the groove, and the first side of the groove and the second side of the groove are in opposite positions.

* * * * *